United States Patent [19]

Gocho et al.

[11] Patent Number: 4,486,787

[45] Date of Patent: Dec. 4, 1984

[54] INTELLIGENT COPIER

[75] Inventors: Nagahiro Gocho; Hitomi Tojiki; Asao Hayashi; Koji Kambara; Toru Nobuto, all of Hachioji City, Japan

[73] Assignee: Olympus Optical Company Limited, Tokyo, Japan

[21] Appl. No.: 407,622

[22] Filed: Aug. 12, 1982

[30] Foreign Application Priority Data

Aug. 14, 1981 [JP] Japan ................................ 56-126561

[51] Int. Cl.$^3$ .......................... H06N 1/22; H06N 1/40
[52] U.S. Cl. ..................................... 358/296; 358/280; 358/287; 358/294; 358/213
[58] Field of Search ............... 358/293, 294, 213, 256, 358/280, 296, 287

[56] References Cited

U.S. PATENT DOCUMENTS 4,344,091 10/1982 Gandner .............................. 358/213
4,365,274 12/1982 Takenouchi ........................ 358/293

OTHER PUBLICATIONS

IEEE Transactions on Electronic Devices, vol. ED 26, No. 12, Dec. 1979, Nishizawa et al., "Static Induction Transistor Image Sensors".
Monthly Copy Machine, vol. 7, No. 9, pp. 10-17, Sep. 25, 1980.

Primary Examiner—Howard W. Britton
Attorney, Agent, or Firm—Fleit, Jacobson, Cohn & Price

[57] ABSTRACT

An intelligent copier for readily performing image enlargement, reduction, synthesis, and editing. In the intelligent copier, an SIT (Static Induction Transistor) image sensor in which a plurality of SIT image cells are arranged two-dimensionally pixel by pixel in the same substrate is used as an image sensor for picking-up the image of a document. It is not necessary to use an expensive mass storage memory for storing the image information, because the SIT image sensor can perform a nondestructive readout, so that the copier can be made small in size and inexpensive in cost.

6 Claims, 10 Drawing Figures

INTELLIGENT COPIER

BACKGROUND OF THE INVENTION

The present invention relates to an intelligent copier comprising an image sensor for deriving an image signal of a document to be copied and a printer for forming an image with the aid of the image signal.

Recently, as copiers developed, the amount of copies made has increased accordingly to a great extent and a variety of requirements for the copier arises. Generally, the requirements mentioned above are roughly classified into two groups such as decentralized processing for personal users by making the copier small and inexpensive and a batch processing by making it high performance and high speed. As for the high performance copier, functions such as image enlargement, reduction, synthesis, edition and color copy are required. In order to meet such requirements, there have been proposed intelligent copiers comprising a mass storage memory for storing image information.

For instance, the International Business Machine Company in the U.S.A. has developed an intelligent copier IBM 6670 and the Konishiroku Company, Iwatsu Company and Ricoh Company in Japan have developed the U-Bix Copier Printer, Iwatsu MG 6000 and Ricoh GT 1000, respectively. For example, the Ricoh GT 1000 comprises a laser beam printer and memory having a capacity of 256 KB and can perform three major functions, i.e., word processing, duplication and editing.

FIG. 1 is a schematic view showing one embodiment of a conventional intelligent copier. In the intelligent copier shown in FIG. 1, a document 1 is illuminated by an illumination lamp 2, and an image of the document thus illuminated is focused onto a sensor 4 through a projection lens 3. An output signal supplied from the sensor 4 is stored in a memory 7 through an interface 5, and a control unit 6 and a processed image with respect to the document 1 is printed out by a printer 8 under the control of the control unit 6. In the known intelligent copiers, use is made of a photo diode array, a CCD image sensor, an MOS image sensor, etc. as the sensor 4. Where a single photo diode element is used as the sensor 4, the document 1 is scanned by moving the sensor 4 two-dimensionally. Moreover, where a single photo diode array, or a CCD or MOS line image sensor is used, the document 1 is scanned by moving the image sensor one-dimensionally with respect to the document 1. Further, where a two-dimensional image sensor is used, the image sensor and the document 1 are fixed. In either case, the document 1 is scanned by the image sensor and the image information is stored in the memory 7 comprising a RAM or a frame memory.

In the known intelligent copier shown in FIG. 1, successive pixel signals of the document 1 are first stored in the memory 7 and then are supplied to the printer 8 after being suitably processed. In the duplication mode, the image signals are directly supplied to the printer 8 through the control unit 6, without storing them in the memory 7, in synchronism with the paper feed of the printer 8, a print head, a scanning of the document image, and so on. Therefore, it is possible to obtain a plurality of copies of the document 1 by storing the image signals of the document 1 in the memory 7 and then printing out a part or the whole of the pixel signals repeatedly, which are read out from the memory 7. Moreover, it is also possible to obtain an enlarged or a reduced copy by changing the pixel distance stored in the memory 7 by desired magnifications. Further, it is possible to obtain a partly erased copy by erasing a part of the image outside of the desired region stored in the memory 7, or by stopping a print-out of the printer 8 except for the desired region, and it is also possible to edit the image by erasing, changing or transferring the desired image region stored in the memory 7.

As mentioned above, the copy functions can be increased easily in a simple process, as compared with the known copier of an electrophotographic type, by storing the image information first in the memory 7. However, the amount of pixels stored in the memory 7 becomes $210 \times 297 \times 10^2 = 6,237,000$ pixels per A4 size paper (210 mm $\times$ 297 mm) if the resolution of the image is assumed to be 10 pixels/mm. Therefore, about 6.3 Mbit are required to obtain a black and white copy in which one pixel is assumed to be one bit, and the required amount is increased abruptly if making a gray level copy or a color copy. Thus, there is a drawback in that the whole copier becomes large in size and expensive in cost since the mass storage memory must be installed in the copier even if use is made of an IC memory or a magnetic disc, etc. as the memory 7.

SUMMARY OF THE INVENTION

The present invention has for its object to eliminate the drawbacks mentioned above by using a SIT image sensor and to provide a novel and useful intelligent copier which can provide various copy functions and can be constructed small in size and inexpensive in cost.

Another object of the present invention is to provide an intelligent copier in which it is not necessary to use a mass storage memory for storing image information.

According to the invention, an intelligent copier for performing image enlargement, reduction, synthesis, and editing comprises

- a static induction transistor image sensor comprising a plurality of static induction transistor image cells arranged thereon two-dimensionally pixel by pixel, each image cell storing respective pixel signals;
- a means for projecting a document image onto said static induction transistor image sensor;
- a control means for selectively reading out the pixel signals from said static induction transistor image sensor and processing the thus read out pixel signals; and
- a printer for forming a copy by printing out said pixel signals processed by said control means.

DESCRIPTION OF THE PREFERRED EMBODIMENTS

Recently, there has been proposed a Static Induction Transistor (hereinafter abbreviated as SIT) having characteristics such as high power, low distortion, low noise and a linear current, vs. voltage characteristic of unsaturated type like a triode, high input impedance, and large amplification. Moreover, an SIT image sensor including the SITs mentioned above has been developed. The intelligent copier according to the invention uses such an SIT image sensor.

Figure 1:
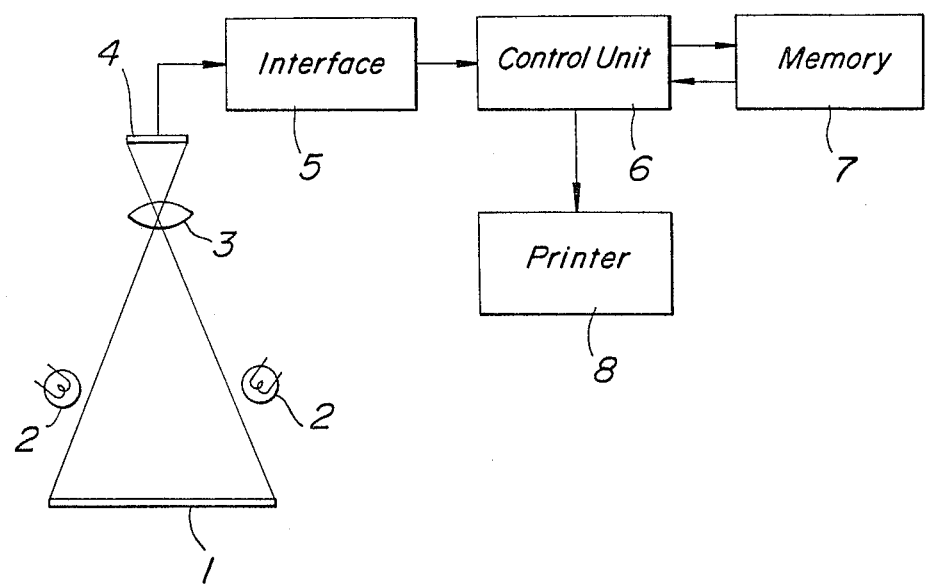
FIG. 1 is a schematic view showing one embodiment of a conventional intelligent copier.
Figure 2A:
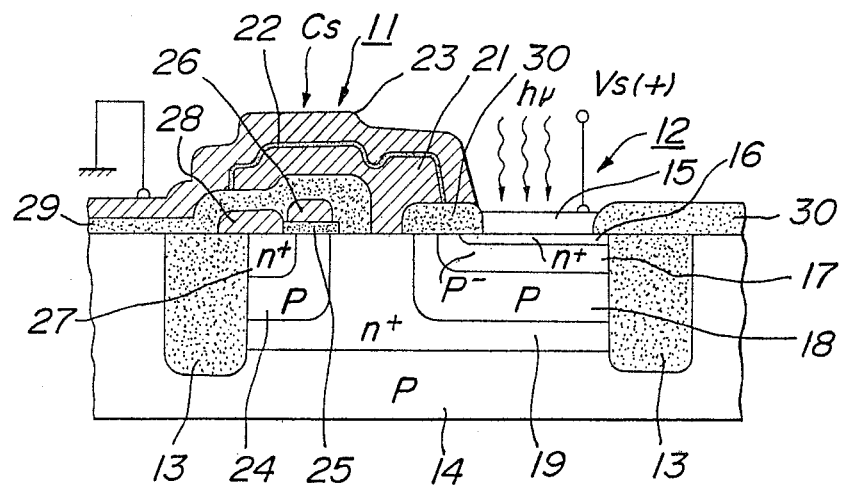
FIGS. 2A and 2B are a cross sectional view and an equivalent circuit diagram, respectively, illustrating one embodiment of one SIT image cell of an SIT image sensor for use in the intelligent copier according to the invention.
Figure 2B:
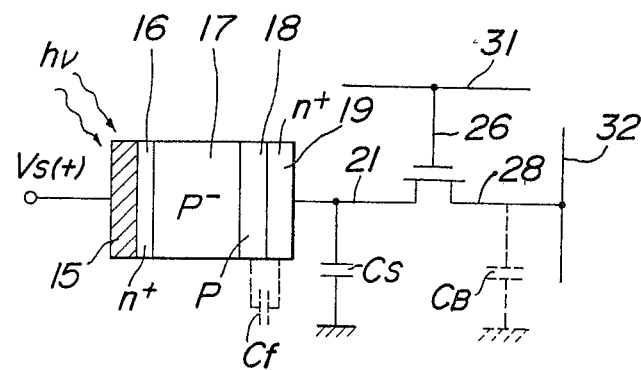

FIGS. 2A and 2B are a cross sectional view and an equivalent circuit diagram, respectively, showing one embodiment of an SIT image cell in the SIT image sensor. The SIT image cell comprises a MOS SIT 11 for reading and a photo-transistor 12 of the front illuminated-type having an amplifying function and including an n+-P junction formed by floating regions. The MOS SIT 11 and the photo-transistor 12 are formed in a p-type semiconductor substrate 14 surrounded by an insulating region 13 for isolation. The photo-transistor 12 is a floating emitter construction including a transparent electrode 15, an n+ layer 16, a p− region 17, a p floating region 18, and an n+ floating region 19. The n+ floating region 19 is an emitter of the photo-transistor 12 and is connected to a drain electrode 21 of the MOS SIT 11 for reading. A conductive layer 23 is coated on the drain electrode 21 through an insulating layer 22, and a storage capacitance $C_s$ is formed by the drain electrode 21, insulating layer 22, and conductive layer 23 in a capacity storing region of the MOS SIT 11. A gate region 24 (p channel) of the MOS SIT 11 is formed in contact with the n+ floating region 19, and a gate electrode 26 is arranged on the gate region 24 through a gate oxide film 25. Moreover, n+ source region 27 is formed in contact with the gate region 24 of p channel, and a source electrode 28 is connected with the source region 27. In the embodiment mentioned above, the drain electrode 21, the conductive layer 23, the gate electrode 26 and the source electrode 28 are isolated from each other by an insulating layer 29, and also the drain electrode 21 of the SIT 11, the conductive layer 23 and the photo-transistor 12 are isolated by an insulating layer 30.

In the SIT image cell mentioned above, a positive bias voltage $V_s(+)$ which is sufficient to make holes in the p− region 17 is supplied to the transparent electrode 15 of the photo-transistor 12. A word line 31 which supplies a signal for reading out the voltage stored in the aforementioned storing region having the storage capacitance $C_s$ through the photo-transistor 12 is connected to the gate electrode 26 of the MOS SIT 11, and also a bit line 32 for supplying the voltage to be read out is connected to the source electrode 28, as shown in FIG. 2B.

Figure 3A:
FIGS. 3A, 3B, 3C, 3D and 3E are waveforms for explaining an operation of the SIT image cell.

Hereinafter, the operation of the SIT image cell will be explained with reference to FIGS. 3A to 3E. FIGS. 3A to 3E are waveforms for explaining the operation of the SIT image cell. When an incident light hv impinges upon the transparent electrode 15 of the photo-transistor 12 under the condition that the positive bias voltage $V_s(+)$ which is sufficient to generate holes in the p− region 17 is supplied as shown in FIG. 3A, electrons of the electron-hole pairs excited by the incident light are absorbed by the n+ layer 16 and holes are accelerated by a strong electric field applied to the p− region 17 to flow into the p floating region 18, so that the p floating region 18 is gradually electrified positively as shown by $V_p(t)$ in FIG. 3B. If the p floating region 18 is electrified positively, the n+ floating region 19 is biased in a forward direction with respect to the p floating region 18. That is to say, the electrons are injected into the p floating region 18 from the n+ floating region 19, and the thus injected electrons are passed through the p floating region 18 and then absorbed by the n+ layer 16 after drifting through the p− region 17 having high resistance. In this manner, when the electrons flow away from the n+ floating region 19, the number of electrons in the region 19 is reduced and thus the region 19 is electrified positively as shown by $V_n(t)$ in FIG. 3C.

The volage $V_n(t)$ of the n+ floating region 19 may be expressed as follows in the case where the p floating region 18 is extremely thin:

$$V_n(t) \simeq \frac{q \cdot s \cdot c}{C_f} \cdot t$$

where $C_f$, q, s, and c represents capacitance of the p floating region 18, unit charge, photon density, and light velocity, respectively. As clearly seen from the above equation, the voltage $V_n(t)$ is in direct proportion to an amount of the incident light flux and an exposure period t, and in inverse proportion to the $C_f$. Therefore, the smaller the capacitance $C_f$ of the p floating region 18 becomes, the larger the voltage variation that can be obtained even if the amount of holes therein is few, so that the sensitivity can be improved considerably. The storage capacity $C_s$ in the aforementioned storing region connected with the n+ floating region 19 does not greatly influence the voltage $V_n(t)$ of the n+ floating region 19, since the electrons continue to flow away from the n+ floating region 19 independent of the $C_s$ until the floating n+ p junction is biased forwardly.

Contrary to this, in the conventional MOS image sensor, the voltage of the storage region is given by $$\frac{q \cdot s \cdot c}{C_s} \cdot t,$$

so that it is possible to make the sensitivity $C_s/C_f$ larger than that of the conventional MOS image sensor if using the SIT image sensor mentioned above. In this case, it is possible to make the $C_s/C_f$ 10–100, since the $C_f$ can readily be made small.

Figure 3B:
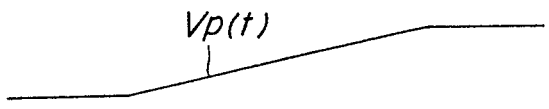
Figure 3C:
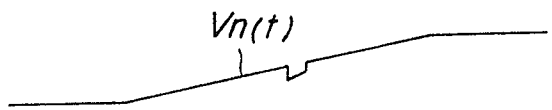
Figure 3D:
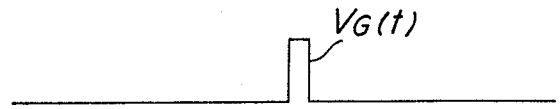
Figure 3E:
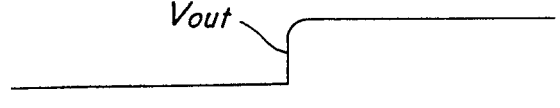

The SIT image cell can be used for both nondestructive and destructive readouts. In the case of performing a nondestructive readout, a pulse voltage shown by $V_G(t)$ in FIG. 3D is applied to the gate of the MOS SIT 11 through the word line 31. If the MOS SIT 11 becomes conductive, the electrons flow into the n+ floating region 19 from the source region 27 through the gate region 24 of the p channel, and thus the positive voltage $V_n(t)$ of the n+ floating region 19 is decreased as shown in FIG. 3C. In this case, since the voltage $V_p(t)$ of the p floating region 18 is increased as shown in FIG. 3B and the floating n+ p junction is deeply biased forwardly, the electrons that flow therein are immediately injected into the p− region 17 having a high resistance. Therefore, it is possible to obtain a readout voltage $V_{out}$ as shown in FIG. 3E not dependent on a parasitic capacitance $C_B$ of the bit line 32. In addition, the voltage of the n+ floating region 19 continues to increase and is stored in the same manner as previously with the lapse of time, even if it is dropped once by performing the readout operation.

As clearly understood from the explanation given above, the SIT image sensor has various characteristics as follows.

(1) Since the SIT has a current vs. voltage characteristic of the unsaturated type showing good linearity, the readout voltage varies linearly over an extremely wide range with respect to the voltage stored in the storing region having the storage capacitance $C_s$ and thus serves to widen the dynamic range considerably.

(2) Since the SIT is highly integrated, it is possible to make the surface area of each SIT image cell extremely small and thus permit high resolution.

(3) It is possible to effect both nondestructive readout and destructive readout.

(4) Since the amplification is large and thus the light detection sensitivity becomes high, it is possible to obtain a sufficiently large signal even if the amount of incident light is small.

(5) Since each cell in the SIT image sensor is driven independently, it is possible to perform a random readout and also to adjust the sensitivity of each cell independently.

(6) Since the electron mobility in the channel is large, it is possible to effect a signal read/write at a high speed.

(7) The SIT for recharging connected to the storing region having the storage capacitance $C_s$ is formed in the same substrate and is driven selectively, thereby it is possible to recharge the storage capacitance $C_s$ easily.

Figure 4:
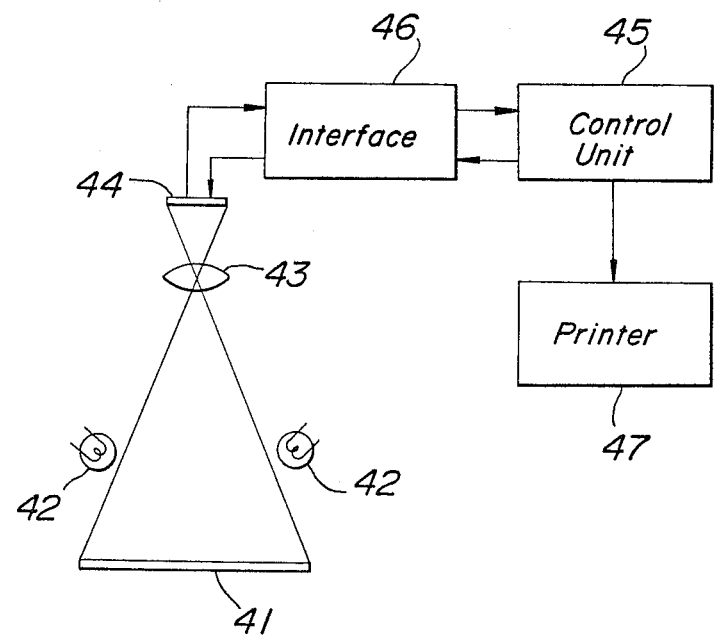
FIG. 4 is a schematic view showing one embodiment of the intelligent copier according to the invention.

FIG. 4 is a schematic view showing one embodiment of an intelligent copier according to the invention. In this embodiment, a document 41 is illuminated by illumination lamps 42 and an image of the thus illuminated document is focused onto an SIT image sensor 44 in which a plurality of SIT image cells are arranged in the same substrate in a matrix form pixel by pixel. The operation of the SIT image sensor 44 i.e., the readout and recharging of each pixel, is performed under the control of a control unit 45 through an interface 46, and the image information thus read out is supplied to the control unit 45 through the interface 46 to perform a desired processing step such as editing, enlargement, reduction, and partial extraction. Then, the thus-processed image information is supplied to a printer 47 to provide a copy.

In the intelligent copier shown in FIG. 4, each pixel of the SIT image sensor 44 is read out during an exposure of a document image or at a desired timing after the exposure, and the thus read out pixel signals are supplied to the printer 47 through the interface 46 and the control unit 45. Therefore, it is possible to obtain one copy with respect to the document 41. In addition, it is further possible to obtain a plurality of copies with respect to the document 41 once exposed by reading out the pixel signals without recharging the SIT image sensor 44 after the exposure of the document to form a plurality of copies by the printer 47. If, in the control unit 45, pixel values to be interpolated are calculated from the readout image signals stored in the SIT image sensor 44 and are supplied to the printer 47, it is possible to obtain an enlarged copy having a desired magnification without decreasing the resolution. Further, if the pixel signals stored in the SIT image sensor are read out in a discrete manner, i.e. every other pixel signal on every other line is read out, it is possible to provide a copy having an image reduced four times. Moreover, if only a desired pixel region of the SIT image sensor 44 is recharged after the exposure of the document, or the pixel signals to be erased are not supplied to the printer 47, it is possible to obtain a copy in which only the desired portion in the document image is partly formed. In addition, if the document image is partly restored during the exposure, a copy having a partly different tone can be obtained. Further, it is possible to obtain a synthesized copy of different document images by exposing the different documents successively without recharging the SIT image sensor 44, since the SIT image sensor 44 has a storing function. Moreover, it is possible to obtain an edited copy by making the readout address of the SIT image sensor 44 differ from an output address to the printer 47, corresponding to edit information in the control unit 45. Of course, it is easy to combine the functions such as enlargement, reduction, modification, erasing, synthesizing, and editing mentioned above so as to form various kinds of copies.

Figure 5:
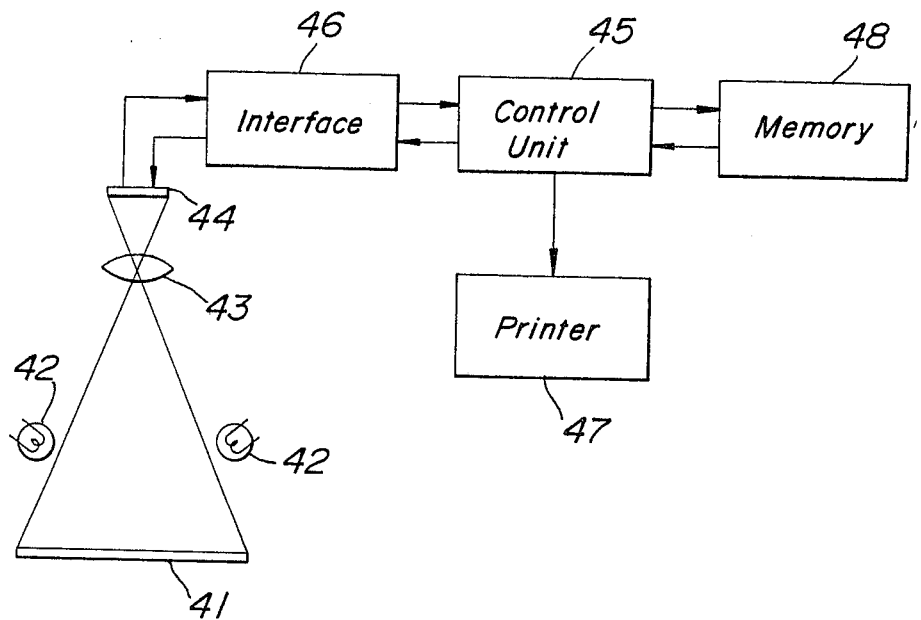
FIG. 5 is a schematic view illustrating another embodiment of the intelligent copier according to the invention.

FIG. 5 is a schematic view showing another embodiment of an intelligent copier according to the invention. In this embodiment, a memory 48 is provided and reading and writing are controlled by the control unit 45. Portions in FIG. 5 similar to those shown in FIG. 4 are denoted by the same reference numerals used in FIG. 4. In such a construction, since external input information such as a letter except for the document can be stored in the memory 48 under the control of the control unit 45, it is possible to edit or synthesize the external input information with the document. Moreover, since the memory 48 is not necessary to store all the pixel signals, the storage can be made small so that it does not substantially increase the size and cost of the copier.

It should be noted that the interface, the control unit and the printer of the intelligent copier according to the invention are similar to those of the known intelligent copier, so that their detailed explanation is omitted.

The present invention is not limited to the embodiments mentioned above, but various alterations or modifications are possible. For example, in the embodiment shown in FIGS. 4 and 5, if a stripe-shaped color filter is applied onto a light incident side of the SIT image sensor 44 and use is made of a color printer as the printer 47, it is possible to form a color copy.

As mentioned above, according to the invention, since use is made of an SIT image sensor which also serves as a memory, it is not necessary to use a mass storage memory, the intelligent copier can be made small in size and inexpensive in cost, and various copy functions can easily be peformed.

What is claimed is:

1. An intelligent copier for copying a document comprising:
   a static induction transistor image sensor having a plurality of static induction transistor image cells arranged two-dimensionally pixel by pixel, each image cell storing respective analog pixel signals which can be read out in a nondestructive manner without substantially affecting the stored signals;
   a means for projecting a document image once onto said static induction transistor image sensor;
   a control means for reading out the analog pixel signals from said static induction transistor image sensor; and
   a printer for receiving the read out analog pixel signals to form at least one copy of said document whereby the analog pixel signals stored in said image cells are capable of being read out a plurality of times to form a plurality of copies of said documents which has been only once exposed onto said static induction transistor image sensor.

2. A copier according to claim 1, wherein the analog pixel signals stored in said static induction transistor image sensor are read out a plurality of times in a nondestructive manner by said control means and said printer forming a plurality of copies of the document which has been exposed once to said static induction transistor image sensor.

3. A copier according to claim 1, wherein a predetermined number of pixel analog signals are selected by said control means to be interpolated to form an enlarged image copy having a desired magnification via said printer.

4. A copier according to claim 1, wherein said analog pixel signals stored in said image cells are read out in a discrete manner by said control means to form a reduced image copy having a desired magnification via said printer.

5. A copier according to claim 1, wherein said image sensor is exposed to a plurality of document images of different documents to form a synthesized copy via said printer by exposing said static induction transistor image sensor a plurality of times corresponding to said plurality of documents without recharging each cell within said static induction transistor image sensor by said control means.

6. A copier according to claim 1, further comprising an external memory having a small memory capacity for storing additional image information to be added to said document image derived from said static induction transistor image sensor, said external memory being coupled to said control means.

* * * * *